United States Patent
Su et al.

(10) Patent No.: US 7,259,458 B2
(45) Date of Patent: Aug. 21, 2007

(54) INTEGRATED CIRCUIT WITH INCREASED HEAT TRANSFER

(75) Inventors: Michael Zhuoying Su, Round Rock, TX (US); David Harry Eppes, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 61 days.

(21) Appl. No.: 11/050,572

(22) Filed: Feb. 3, 2005

(65) Prior Publication Data

US 2006/0038283 A1   Feb. 23, 2006

Related U.S. Application Data

(63) Continuation-in-part of application No. 10/920,764, filed on Aug. 18, 2004, now abandoned.

(51) Int. Cl.
*H01L 23/34* (2006.01)

(52) U.S. Cl. ............... 257/713; 257/E23.102

(58) Field of Classification Search ......... 257/713
See application file for complete search history.

(56) References Cited

U.S. PATENT DOCUMENTS

| | | | |
|---|---|---|---|
| 5,196,785 A | 3/1993 | Douglas | |
| 5,206,713 A * | 4/1993 | McGeary | 257/684 |
| 5,223,747 A | 6/1993 | Tschulena | |
| 5,767,578 A | 6/1998 | Chang et al. | |
| 5,773,362 A | 6/1998 | Tonti et al. | |
| 5,990,552 A | 11/1999 | Xie et al. | |
| 6,100,199 A | 8/2000 | Joshi et al. | |
| 6,184,064 B1 * | 2/2001 | Jiang et al. | 438/113 |
| 6,225,695 B1 | 5/2001 | Chia et al. | |
| 6,263,566 B1 | 7/2001 | Hembree et al. | |
| 6,281,029 B1 | 8/2001 | Goruganthu et al. | |
| 6,287,940 B1 | 9/2001 | Cole et al. | |
| 6,300,670 B1 | 10/2001 | Kramer et al. | |

(Continued)

FOREIGN PATENT DOCUMENTS

DE   100 30 443 A1   1/2002

OTHER PUBLICATIONS

AMD, "Thermal, Mechanical, and Chassis Cooling Design Guide," Advanced Micro Devices, Inc., Publication #23794, Rev. H, Nov. 2002, pp. i-x and 1-20.

(Continued)

*Primary Examiner*—Lex H. Malsawma
(74) *Attorney, Agent, or Firm*—Zagorin O'Brien Graham LLP

(57) ABSTRACT

A technique for improving the thermal power dissipation of an integrated circuit includes reducing the thermal resistivity of the integrated circuit by increasing heat transfer in vertical and/or lateral directions. These results are achieved by increasing the surface area of the backside and/or the surface area of the lateral sides of the integrated circuit die. In some embodiments of the invention, an integrated circuit includes circuit elements formed closer to a first surface of a semiconductor substrate than to a second surface of the semiconductor substrate. The semiconductor substrate has a varying profile that substantially increases the surface area of a thermal interface formed on the second surface as compared to the second surface being substantially planar. A maximum depth of the profile is less than the thickness of the semiconductor substrate.

18 Claims, 3 Drawing Sheets

U.S. PATENT DOCUMENTS

| | | |
|---|---|---|
| 6,333,557 B1 | 12/2001 | Sullivan |
| 6,512,292 B1 | 1/2003 | Armbrust et al. |
| 6,586,279 B1 * | 7/2003 | Davidson et al. ........... 438/122 |
| 6,607,928 B1 | 8/2003 | Eiles et al. |
| 6,613,602 B2 | 9/2003 | Cooper et al. |
| 6,627,978 B2 | 9/2003 | Dujari et al. |
| 6,710,442 B1 * | 3/2004 | Lindgren et al. ........... 257/706 |
| 6,774,482 B2 * | 8/2004 | Colgan et al. .............. 257/712 |
| 2004/0061163 A1 | 4/2004 | Nakayama |

OTHER PUBLICATIONS deSorgo, Dr. Miksa, "Thermal Interface Materials," Electronics Cooling, http://www.electronics-cooling.com/Resources/EC_Articles/SEP96/sep96_01.htm, Sep. 1996, pp. 1-7.

PCT International Search Report PCT/US2005/015048, mailed Jan. 26, 2006; Applicant: Advanced Micro Devices, Inc.; International Filing Date, Apr. 29, 2005; 12 pages.

* cited by examiner

INTEGRATED CIRCUIT WITH INCREASED HEAT TRANSFER

CROSS-REFERENCE TO RELATED APPLICATION(S)

This application is a continuation-in-part of application Ser. No. 10/920,764, filed Aug. 18, 2004 now abandoned, entitled "INTEGRATED CIRCUIT WITH INCREASED HEAT TRANSFER" by Michael Zhuoying Su, which application is hereby incorporated by reference.

BACKGROUND

1. Field of the Invention

The present invention relates to integrated circuits, and more particularly to thermal power dissipation of integrated circuits.

2. Description of the Related Art

High temperatures of integrated circuits may decrease reliability and efficiency of the integrated circuit. As the density of transistors on an integrated circuit increases and transistor sizes decrease, thermal power generated by the circuit increases, thus increasing the need for removing heat from a packaged integrated circuit. For example, an increase in transistor density may result in an increase in power density by a factor of two or three.

The thermal resistance of a packaged part typically includes thermal resistance contributions from a lid, a thermal interface material (TIM) between the lid and a backside of an integrated circuit, and the integrated circuit itself. To reduce the overall thermal resistance of the packaged part, one or all of these contributions may be reduced. To improve a thermal resistance of the lid or the TIM, new materials may be used. However, silver or gold alloys which have a low thermal resistance, may be cost prohibitive for the lid of typical integrated circuits. The thickness of the lid may be reduced to reduce the lid's thermal resistance, but elimination of the lid leaves the integrated circuit vulnerable to cracking. Reducing the thermal resistance of the TIM also may be impracticable because although a thermal interface provided by typical TIMs is inferior to thermal interfaces provided by other materials (e.g., some metals or diamond), TIMs are softer than other materials and reduce cracking of the integrated circuit die.

Accordingly, improved techniques for removing heat from a packaged integrated circuit are desired.

SUMMARY

A technique for improving the thermal power dissipation of an integrated circuit includes reducing the thermal resistivity of the integrated circuit by increasing heat transfer in vertical and/or lateral directions. These results are achieved by increasing the surface area of the backside and/or the surface area of the lateral sides of the integrated circuit die. In some embodiments of the invention, an integrated circuit includes circuit elements formed closer to a first surface of a semiconductor substrate than to a second surface of the semiconductor substrate. The semiconductor substrate has a varying profile that substantially increases the surface area of a thermal interface formed on the second surface as compared to the second surface being substantially planar. A maximum depth of the profile is less than the thickness of the semiconductor substrate.

In some embodiments of the present invention, an integrated circuit includes circuit elements formed closer to a first surface of a semiconductor substrate than to a second surface of the semiconductor substrate. The semiconductor substrate has a varying profile. The varying profile substantially increases the surface area of a thermal interface formed on the second surface as compared to the second surface being substantially planar. A thermally conductive layer is thermally coupled to the semiconductor substrate. The thermally conductive layer is electrically isolated from the circuit elements. The thermally conductive layer interfaces a dielectric layer formed between the first surface of the semiconductor substrate and the circuit elements.

In some embodiments of the present invention, a method includes reducing a thermal resistivity of an integrated circuit die by increasing a surface area of a first surface of a semiconductor substrate. Circuit elements are formed closer to a second surface of the semiconductor substrate than to the first surface. A maximum depth of a profile of the first surface is less than a thickness of the semiconductor substrate.

In some embodiments of the present invention, a method includes reducing a thermal resistivity of an integrated circuit die by increasing the surface area of a first surface of a semiconductor substrate. Circuit elements are formed closer to a second surface of the semiconductor substrate than to the first surface. The method also includes reducing the thermal resistivity of the die by thermal dissipation via a thermally conductive layer formed on the first side of the die. The thermally conductive layer is electrically isolated from the circuit elements and interfaces a dielectric layer formed between the second surface of the semiconductor substrate and the circuit elements.

In some embodiments of the invention, a method of manufacturing an integrated circuit includes forming circuit elements closer to a first surface of a semiconductor substrate than to a second surface of the semiconductor substrate. The method also includes forming the semiconductor substrate having a varying profile. The varying profile substantially increases the surface area of a thermal interface formed on the second surface as compared to the second surface being substantially planar. A maximum depth of the profile is less than the thickness of the semiconductor substrate. The method may include forming a thermally conductive layer thermally coupled to the semiconductor substrate. The thermally conductive layer is electrically isolated from the circuit elements. The thermally conductive layer may include an interface to ambient having a varying profile. The varying profile substantially increases the surface area of the interface to ambient as compared to the interface to ambient being substantially planar. The method may include forming a thermal interface material (TIM) layer adjacent to the thermally conductive layer and forming a lid adjacent to the TIM layer. The thermally conductive layer has a substantially planar interface to the TIM layer. The increases in density of profile variations may be based at least in part on portions of the integrated circuit generating greater thermal power than other portions of the integrated circuit.

In some embodiments of the invention, a method of manufacturing an integrated circuit includes forming circuit elements closer to a first surface of a semiconductor substrate than to a second surface of the semiconductor substrate. The method includes forming the semiconductor substrate having a varying profile. The varying profile substantially increases the surface area of a thermal interface formed on the second surface as compared to the second surface being substantially planar. The method includes forming a thermally conductive layer thermally coupled to the semiconductor substrate. The thermally conductive layer is electrically isolated from the circuit elements. The thermally conductive layer interfaces a dielectric layer formed between the first surface of the semiconductor substrate and the circuit elements. The thermally conductive layer may include an interface to ambient, the interface having a varying profile. The varying profile may substantially increase the surface area of the interface as compared to the interface being substantially planar. The method may include forming a thermal interface material (TIM) layer adjacent to the thermally conductive layer and forming a lid adjacent to the TIM layer. The thermally conductive layer may have a substantially planar interface to the TIM layer. Increases in density of profile variations of the second surface may be based at least in part on hot spots of the integrated circuit.

In some embodiments of the present invention, an integrated circuit die includes at least one lateral side of the die having a varying profile. The varying profile substantially increases the surface area of a thermal interface formed on the lateral side as compared to the lateral side being substantially planar. In some embodiments of the present invention, a method includes reducing a thermal resistivity of an integrated circuit die by increasing a surface area of a lateral side of the die. The method may include reducing the thermal resistivity of the die by thermal dissipation via a thermally conductive layer formed on the lateral side of the die.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
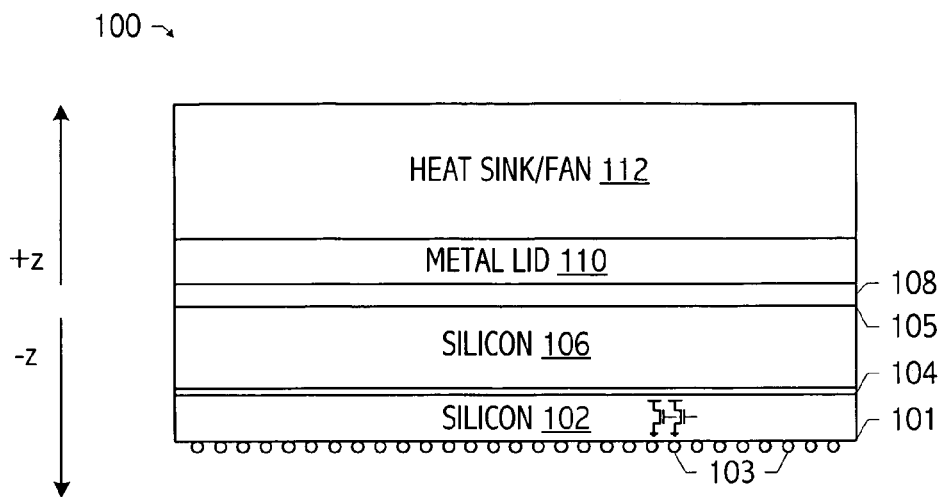
FIG. 1 illustrates a cross-sectional view of an exemplary packaged integrated circuit.

Referring to FIG. 1, an exemplary integrated circuit and cooling technique includes a silicon substrate 106, insulator layer 104, and silicon layer 102. Silicon layer 102 includes substantially all of the circuit devices in packaged integrated circuit 100. The interface, e.g., interface 101, between silicon layer 102 and conductive bumps 103 is the front side of the integrated circuit. Interface 105, i.e., the interface between silicon substrate 106 and thermal interface material (TIM) 108, is the backside of the integrated circuit and is substantially planar.

Thermal interface material 108 is included between metal lid 110 and silicon substrate 106 to eliminate air gaps produced by surface irregularities of metal lid 110 and silicon substrate 106 and to increase joint conductivity to improve heat transfer between metal lid 110 and silicon substrate 106. Thermal interface material 108 may be a thermal grease, thermally conductive compound (e.g., an aluminum compound), thermally conductive elastomer, thermally conductive adhesive tape, or other suitable material.

Heat sink 112 (e.g., a fan or other power dissipating structure) is attached to metal lid 110 to increase the heat transfer between metal lid 110 and the ambient environment (e.g., surrounding air). An additional thermal interface material layer may be included between metal lid 110 and heat sink 112 to eliminate air gaps between metal lid 110 and heat sink 112 and to increase joint conductivity to improve heat transfer from metal lid 110 to heat sink 112.

An exemplary TIM transfers less heat from the silicon interface than other low-thermal resistance materials (e.g., metals). A technique for increasing the heat transfer of the cooling scheme illustrated in FIG. 1 includes inserting a layer of material having a high thermal conductivity (i.e., greater than approximately 10 W/mK) between silicon substrate 106 and TIM 108. However, the rate of heat transfer by this cooling technique may be limited by the surface area of the substantially planar interface 105. Interface 105 is fixed to the size of the integrated circuit backside, limiting the rate of power dissipation. Typically, approximately 90% of heat transferred from the integrated circuit is transferred in a positive z-direction (i.e., vertically, in a direction orthogonal to interface 105) and approximately 10% of heat transferred from the integrated circuit is transferred in a negative z-direction. A negligible amount of heat (typically no more than approximately 1 to 2%) is transferred in a lateral direction (i.e., a direction parallel to interface 105) from the lateral sides of the integrated circuit.

Figure 2A:
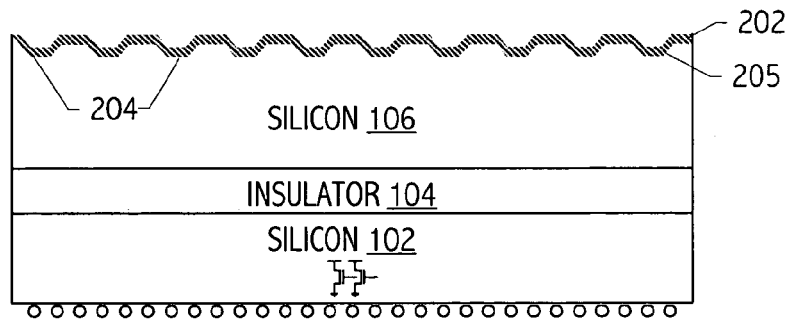
FIG. 2A illustrates a cross-sectional view of an exemplary integrated circuit including a semiconductor substrate having a backside with a varying profile consistent with some embodiments of the present invention.
Figure 2B:
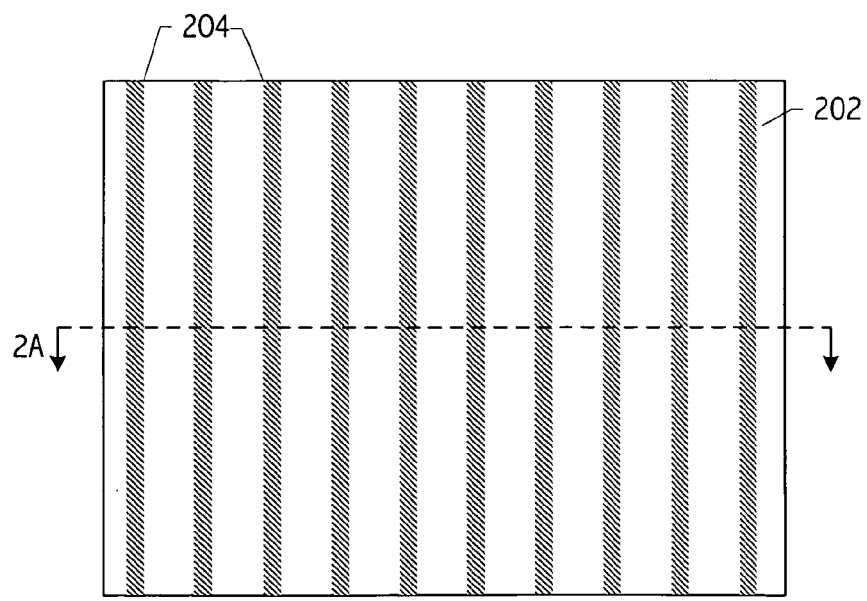
FIG. 2B illustrates a top-down view of an exemplary integrated circuit including a semiconductor substrate having a backside with a varying profile consistent with some embodiments of the present invention.
Figure 3:
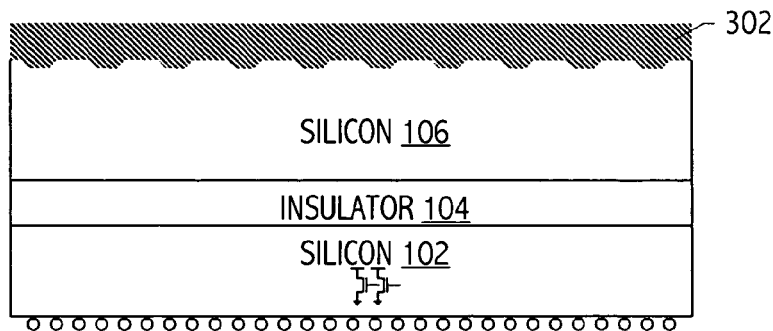
FIG. 3 illustrates a cross-sectional view of an exemplary integrated circuit including a semiconductor substrate having a backside with a varying profile and a thermally conductive layer with a planar profile consistent with some embodiments of the present invention.

Techniques for improving the heat transfer of the aforementioned cooling techniques are illustrated in FIGS. 2A–5B. Referring to FIGS. 2A and 2B, an integrated circuit formed by silicon substrate 106, insulator layer 104, and silicon layer 102 has at least a portion of its backside (i.e., interface 205) that has a varying profile (i.e., a substantially non-planar profile). Although it is customary to fabricate integrated circuit devices circuit-side up, backside processing may be performed after completion of the front side processing. Interface 205 may be formed by any suitable manufacturing technique (e.g., patterning and etching the backside of silicon substrate 106) to form trenches (e.g., trenches 204), vias, holes, grooves, or other suitable non-planar structures in silicon substrate 106. In one embodiment of the invention, roughing-up the backside of silicon substrate 106 forms scratches in the backside of silicon substrate 106. The varying profile increases the surface area of at least a portion of the interface between silicon substrate 106 and thermally conductive layer 205, thus increasing the vertical heat transfer from the backside of silicon substrate 106 to an adjacent material.

Thermally conductive layer 202 may be formed on the substantially nonplanar backside of silicon substrate 106. Thermally conductive layer 202 may be a metal, diamond, or other suitable thermally conductive material. In some embodiments of the invention, thermally conductive layer 202 may be a TIM (e.g., a TIM having a high thermal conductivity), and a separate thermally conductive layer may be excluded. The thickness of thermally conductive layer 202 may vary with the depth of the trenches and the material used. For example, although a thinner thermally conductive layer may be preferable to a thicker thermally conductive layer, the thermally conductive layer is typically thick enough to provide substantially complete coverage of the trench or other non-planar structure. In addition, if the thermally conductive layer is too thin, it may be brittle, increasing the likelihood of fracturing the thermally conductive layer, which may impede lateral heat transfer across the layer. Although other materials (e.g., silver, gold, diamond, etc.) are better thermal conductors than copper, copper may be used because it is softer and less expensive than other thermal conductors. Although diamond is a better thermal conductor than other materials (e.g., materials including copper, silver, or gold), in general, to form a diamond layer on the integrated circuit, the integrated circuit is typically exposed to hot conditions and high pressure, which may be undesirable in some applications. In addition, forming thicknesses of a diamond layer greater than approximately 1000 μm may be too time consuming for some applications.

The depth of the profile of the backside of silicon substrate 106 may depend on the material chosen to be the thermal conductor. For example, when using diamond as the thermal conductor, since diamond is also an electrical insulator, the profile depth may extend through the silicon substrate to insulator layer 104. However, the profile depth may extend through less than the entire silicon substrate to reduce the likelihood of electrical coupling to circuitry in silicon layer 102, e.g., when an electrically conductive material is chosen as the thermal conductor.

In one embodiment of the present invention, the integrated circuit of FIG. 2A is packaged in a lidless package, transferring heat from the backside of silicon substrate 102 to the ambient environment via a substantially non-planar interface between thermally conductive layer 202 and the ambient environment. However, in some embodiments of the invention, e.g., an integrated circuit package including a lid, a thermally conductive layer (e.g., thermally conductive layer 302 of FIG. 3) having one substantially planar interface between the thermally conductive layer and an adjacent material (e.g., a TIM layer or a metal lid) may be used. In some embodiments of the invention, thermally conductive layer 302 may be a TIM (e.g., a TIM having a high thermal conductivity), and a separate thermally conductive layer may be excluded.

Figure 4A:
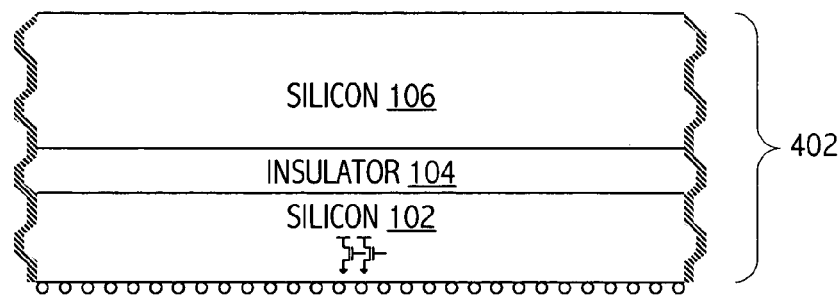
FIG. 4A illustrates a cross-sectional view of an exemplary integrated circuit having lateral sides with a varying profile consistent with some embodiments of the present invention.
Figure 4B:
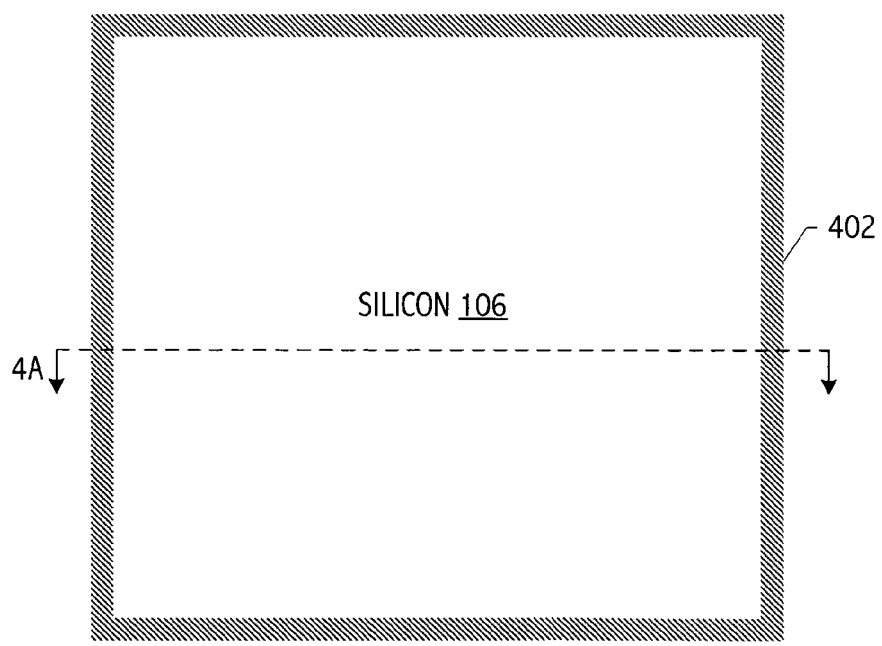
FIG. 4B illustrates a top-down view of an exemplary integrated circuit having lateral sides with a varying profile consistent with some embodiments of the present invention.

One technique for improving the vertical heat transfer includes thinning the integrated circuit die, which may make thermal dissipation in the lateral direction more critical. In one embodiment of the invention, the lateral heat transfer of an integrated circuit may be increased by increasing the surface area of the lateral sides of the integrated circuit as illustrated in FIGS. 4A and 4B. Conventional techniques to form a varying profile may be used to vary the profile of a portion of a lateral side of an integrated circuit, prior to the integrated circuits being separated from a wafer into individual die. Conventional techniques for forming a varying profile on the front side or backside of an integrated circuit may be adapted to form a varying profile on a lateral side of the integrated circuit (e.g., using specialized chambers) after the integrated circuit die has been separated from the wafer. A laser or other suitable technique may also be used to vary the profile of the lateral sides of the integrated circuit die.

After forming a varying profile on the lateral sides, a layer of a thermally conductive material (e.g., thermally conductive layer 402) may be formed on the lateral sides. As described above for thermally conductive layer 202, thermally conductive layer 402 may include copper, silver, gold, diamond, a TIM, or other suitable thermally conductive materials. The depth of thermally conductive layer 402 may be chosen according to the material chosen for the layer, as described above, and according to the location of devices in silicon layer 102.

Figure 5A:
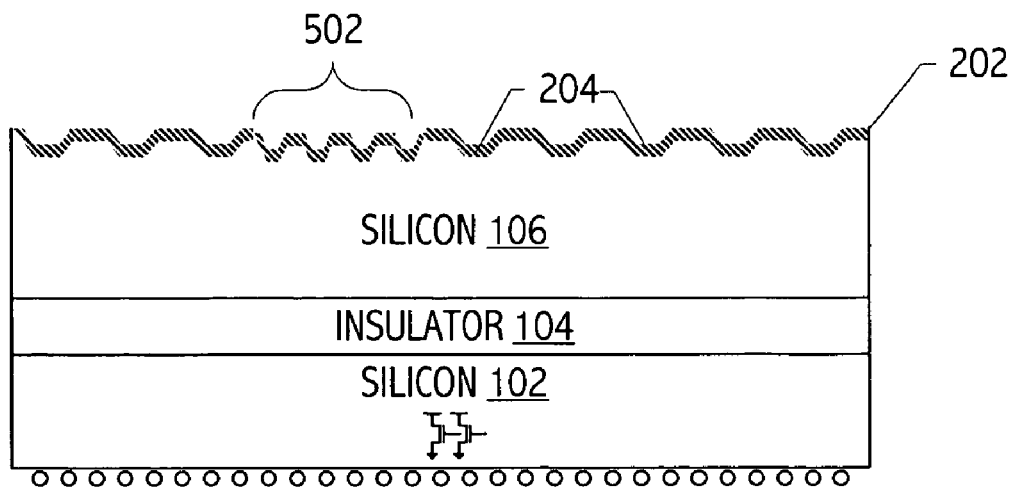
FIG. 5A illustrates a cross-sectional view of an exemplary integrated circuit including a semiconductor substrate having a backside with a non-uniformly varying profile consistent with some embodiments of the present invention.
Figure 5B:
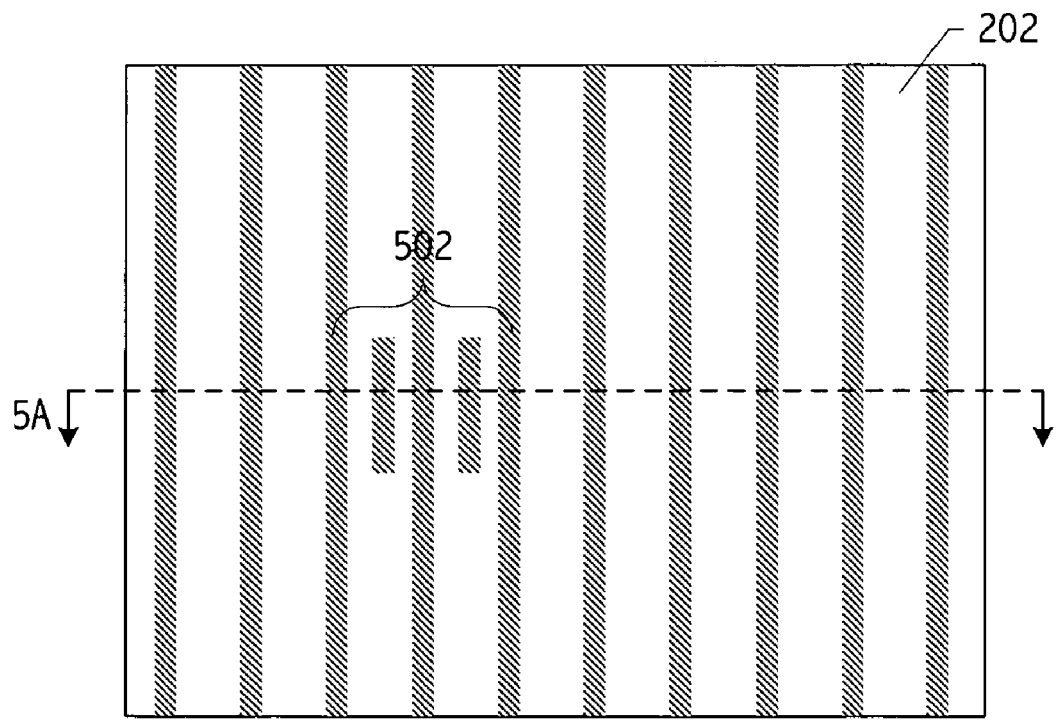
FIG. 5B illustrates a top-down view of an exemplary integrated circuit including a semiconductor substrate having a backside with a non-uniformly varying profile consistent with some embodiments of the present invention.

In some embodiments of the invention, the profile of the silicon substrate backside or lateral sides may be tailored according to a heat profile of the integrated circuit design. For example, some portions of the integrated circuit (i.e., hot spots, e.g., those portions exercised at a high rate) may generate more heat than others. Hot spots may slow down transistors proximate to the hot spots and contribute to race conditions in the integrated circuit. Regions of a lateral side or backside having greater profile variations than other locations of the integrated circuit (e.g., trenches 502) may be included to improve thermal power dissipation of these hot spots, as illustrated in FIGS. 5A and 5B. Thus, this technique may reduce the occurrence of hot spots and race conditions produced by those hot spots. The varying profile may also be configured in patterns that strengthen the integrated circuit die as compared to other profiles (e.g., cross-hatching or serpentine patterns).

The description of the invention set forth herein is illustrative, and is not intended to limit the scope of the invention as set forth in the following claims. For example, while the invention has been described in an embodiment implemented in silicon-on-insulator and silicon semiconductor technology, one of skill in the art will appreciate that the teachings herein can be utilized with other integrated circuit manufacturing technologies, e.g., bulk silicon technology, gallium arsenide technology, etc. Variations and modifications of the embodiments disclosed herein, may be made based on the description set forth herein, without departing from the scope and spirit of the invention as set forth in the following claims.

What is claimed is:

1. An integrated circuit die comprising:
at least one lateral side of the die having a varying profile, the varying profile substantially increasing the surface area of a thermal interface formed on the lateral side as compared to the lateral side being substantially planar, wherein the lateral side of the die is orthogonal to layers of the integrated circuit die forming circuit elements.

2. The integrated circuit die, as recited in claim 1, further comprising:
a thermally conductive layer thermally coupled to the lateral side of the die, the thermally conductive layer being electrically isolated from the circuit elements.

3. The integrated circuit die, as recited in claim 1, further comprising:
circuit elements formed closer to a first surface of a semiconductor substrate than to a second surface of the semiconductor substrate;

the semiconductor substrate having a varying profile, the varying profile substantially increasing the surface area of a thermal interface formed on the second surface as compared to the second surface being substantially planar; and wherein a maximum depth of the profile is less than the thickness of the semiconductor substrate.

4. The integrated circuit die, as recited in claim 3, further comprising:

a thermally conductive layer thermally coupled to the semiconductor substrate, the thermally conductive layer being electrically isolated from the circuit elements.

5. The integrated circuit die, as recited in claim 4, wherein the thermally conductive layer comprises an interface to ambient having a varying profile, the varying profile substantially increasing the surface area of the interface to ambient as compared to the interface to ambient being substantially planar.

6. The integrated circuit die, as recited in claim 4, wherein the thermally conductive layer has a substantially planar interface to a thermal interface material (TIM).

7. The integrated circuit die, as recited in claim 4, wherein the thermally conductive layer is a thermal interface material (TIM).

8. The integrated circuit die, as recited in claim 4, further comprising:

a thermal interface material (TIM) layer adjacent to the thermally conductive layer.

9. The integrated circuit die, as recited in claim 8, further comprising:

a lid adjacent to the TIM layer.

10. The integrated circuit die, as recited in claim 3, wherein increases in density of profile variations are based at least in part on portions of the integrated circuit generating greater thermal power than other portions of the integrated circuit.

11. The integrated circuit die, as recited in claim 1, further comprising:

circuit elements formed closer to a first surface of a semiconductor substrate than to a second surface of the semiconductor substrate;

the semiconductor substrate having a varying profile, the varying profile substantially increasing the surface area of a thermal interface formed on the second surface as compared to the second surface being substantially planar;

a thermally conductive layer thermally coupled to the semiconductor substrate, the thermally conductive layer being electrically isolated from the circuit elements; and wherein the thermally conductive layer interfaces a dielectric layer formed between the first surface of the semiconductor substrate and the circuit elements.

12. The integrated circuit die, as recited in claim 11, wherein the thermally conductive layer comprises an interface to ambient, the interface to ambient having a varying profile, the varying profile substantially increasing the surface area of the interface to ambient as compared to the interface to ambient being substantially planar.

13. The integrated circuit die, as recited in claim 11, further comprising:

a thermal interface material (TIM) layer adjacent to the thermally conductive layer, the thermally conductive layer having a planar interface to the TIM layer; and a lid adjacent to the TIM layer.

14. The integrated circuit die, as recited in claim 11, wherein increases in density of profile variations of the second surface are based at least in part on portions of the integrated circuit generating greater thermal power than other portions of the integrated circuit.

15. The integrated circuit die, as recited in claim 11, wherein the thermally conductive layer is a thermal interface material.

16. An apparatus comprising:

a lateral surface of an integrated circuit die, the lateral surface having a varying profile, the varying profile substantially increasing the surface of the lateral surface as compared to a substantially planar lateral surface; and a thermally conductive layer formed on the lateral surface and configured to reduce a thermal resistivity of the integrated circuit die by thermal dissipation, wherein the lateral surface of the integrated circuit die is orthogonal to layers of the integrated circuit die forming circuit elements.

17. An apparatus comprising:

a first surface of a semiconductor substrate, the first surface having a varying profile, the varying profile substantially increasing the surface area of the first surface as compared to a substantially planar first surface, circuit elements being formed closer to a second surface of the semiconductor substrate than to the first surface;

a thermally conductive layer formed on the first surface and configured to reduce a thermal resistivity of the die by thermal dissipation;

wherein the thermally conductive layer is electrically isolated from the circuit elements; and wherein a dielectric layer formed between the second surface of the semiconductor substrate and the circuit elements.

18. The apparatus, as recited in claim 17, wherein the thermally conductive layer has a varying profile.

\* \* \* \* \*

UNITED STATES PATENT AND TRADEMARK OFFICE
CERTIFICATE OF CORRECTION

PATENT NO. : 7,259,458 B2
APPLICATION NO. : 11/050572
DATED : August 21, 2007
INVENTOR(S) : Michael Zhuoying Su and David Harry Eppes It is certified that error appears in the above-identified patent and that said Letters Patent is hereby corrected as shown below:

Col. 8, (Claim 16) line 24, please replace "surface of" with --surface area of--

Signed and Sealed this

Twenty-third Day of October, 2007

JON W. DUDAS
*Director of the United States Patent and Trademark Office*